United States Patent [19]
Berberidis et al.

[11] Patent Number: 6,052,702
[45] Date of Patent: Apr. 18, 2000

[54] DECISION FEEDBACK FILTER DEVICE IN THE FREQUENCY DOMAIN

[75] Inventors: Constantinos Berberidis, Patras, Greece; Jacques Palicot, Rennes, France

[73] Assignee: France Telecom, Paris, France

[21] Appl. No.: 09/043,142

[22] PCT Filed: Sep. 9, 1996

[86] PCT No.: PCT/FR96/01377

§ 371 Date: Jul. 13, 1998

§ 102(e) Date: Jul. 13, 1998

[87] PCT Pub. No.: WO97/09781

PCT Pub. Date: Mar. 13, 1997

[30] Foreign Application Priority Data

Sep. 8, 1995 [FR] France .................................. 95 10569

[51] Int. Cl.[7] .................................................. G06F 17/00
[52] U.S. Cl. ........................ 708/319; 708/322; 375/233
[58] Field of Search ..................... 708/320, 321, 708/322, 323; 375/233

[56] References Cited

FOREIGN PATENT DOCUMENTS 0 641 102  3/1995  European Pat. Off. .

OTHER PUBLICATIONS

Signal Processing 5: Theories and Applications; Proceedings of EUSIPCO–90; *On the Convergence Properties of Partitioned Block Frequency Domain Adaptive Filter* (PBFDAF), Sommen; Sep. 18, 1990 pp. 201–204.

*Primary Examiner*—Chuong Dinh Ngo
*Attorney, Agent, or Firm*—Nilles & Nilles SC

[57] ABSTRACT

A decision feedback filter device which has a forward filter (FF) and a feedback filter (FB) for the production, from input symbols (x(n)), of the corresponding decisions (d(n)), the forward filter (FF) receiving the input symbols at input, and the feedback filter (FB) receiving the decisions (d(n)) at input. The forward filter (FF) carries out a frequency domain filtering of blocks of M input symbols, and the feedback filter (FB) carries out a frequency domain filtering of blocks of L decisions, with L being lower than M. The feedback filter permits the intersymbol interference caused by the reception of echoes to be rectified.

8 Claims, 4 Drawing Sheets

FIG_6

FIG_7

FIG_8

FIG_9

DECISION FEEDBACK FILTER DEVICE IN THE FREQUENCY DOMAIN

BACKGROUND OF THE INVENTION

1. Field of the Invention

The invention relates to a decision feedback device for the filtering of a digital signal, working in the frequency domain. The invention can be applied, for example to the cancellation of echoes generated by multipath propagation during the RF transmission of a digital signal in particular.

2. Description of the Related Art

A major problem in terrestrial transmission systems is that of signal distortion due to the phenomenon of multipath propagation. The reflection of a transmitted signal on dwellings, relief features or various layers of the atmosphere gives rise to the reception of several signals or echoes instead of only one signal. The undesirable echoes received are generally out of phase and time-lagged, and have amplitudes that are attenuated as compared with the origin signal (all in a manner that is variable in time, depending on the path followed). Since these phenomena depend, as far as their variation is concerned, chiefly on weather phenomena, they change slowly for a fixed reception system.

In digital transmission, the echoes received induce a distortion of the received symbols. This distortion results in a phenomenon of overlapping of the symbols, also called intersymbol interference. In order to ensure high quality reception, the resulting intersymbol interference must be eliminated or substantially reduced.

The pulse response of a multipath channel extends over a typical time interval of some tens of microseconds. This interval, which is a function of the frequency used, corresponds typically to a few hundreds of successive symbols in digital television broadcasting systems. One of the symbols received (see FIG. 2) corresponds to a symbol $(x(n))$ that is actually transmitted at the beginning, and the other symbols $(x(n+i), x(n-j))$ are parasitic symbols (or echoes) resulting from the multipath propagation. One processing approach involves the use of high-order digital filters, i.e. a large number of corrective coefficients, at reception, in order to eliminate the parasitic symbols (and produce, through a decision device, a sequence of decisions actually corresponding to the transmitted data).

The sampled pulse response of a multipath channel can be put in the following form:

$$h(t) = \delta_k(t) + \Sigma_k \alpha_k \Sigma(t - t_k),$$

with K as an index that is a integer ranging from 1 to p in considering p paths, $\alpha_k$ and $t_k$ being the effective gain and temporal delay respectively of the kth path, (t) being transmitted pulse. The gains are generally complex. The time delays $t_k$ are positive (echoes known as postcursor echoes) or negative (echoes known as precursor echoes). In practice the precursor echoes are temporally very close to the signal relating to the main path (typically at a temporal distance of less than 1 microsecond) whereas the postcursor echoes are fairly spread out temporally (being typically received with a time lag of 0 to 40 microseconds).

As we have seen, the phenomenon of multipath propagation changes over time, and it is therefore necessary to adapt the filtering coefficients temporally. Filters known as adaptive filters are used to this end. These adaptive filters, according to their principle, comprise a variable coefficient filter and a computation device providing these coefficients to the filter as a function, firstly, of the sequences of symbols received and produced by the filter, and, secondly, of the sequences of corresponding decisions. The coefficient adaptation devices are physically uncoupled for high sampling rates (for example rates of over one megahertz). The adapting of the coefficients is usually done in a digital signal processor or DSP, and the filter is normally made on a VLSI (Very Large Scale Integration) circuit. An approach of this type is described, for example, in the document EP-A-0 641 102. The temporal type processing is conventionally carried out therein symbol by symbol.

In terms of adaptation of coefficients, a known approach lies in the use of adaptation techniques known as techniques of adaptation on the basis of blocks of symbols: the coefficients are prepared out of blocks of symbols. Thus, a faster convergence is obtained than in the case of step-by-step algorithms. Fast linear filters are then used to carry out time domain filtering, symbol by symbol, or frequency domain filtering by blocks of symbols. A linear filtering of this kind, performed in the frequency domain, makes it possible, as compared time domain filtering, to reduce the number of computations through the replacement of a temporal convolution by a frequency multiplication. An approach of this kind, for example, is described in the article "On The Convergence Properties Of Partitioned Block Frequency Domain Adaptive Filter (PBFDAF)" in Torres L., Masgrau E., Lagunas M. A. (eds), *Signal Processing V: Theories and Applications*; Proceedings of EUSIPCO—90, Fifth European Signal Processing Conference, Barcelona, Sep. 18–21, 1990, Vol.1, Sep. 18, 1990, pages 201–204.

Nevertheless this filtering structure does not make it possible, with an accessible degree of complexity, to obtain sufficient correction in the case of the long echoes, in particular when the temporal spread of the echoes exceeds about a hundred symbols.

OBJECTS AND SUMMARY OF THE INVENTION

Figure 1:
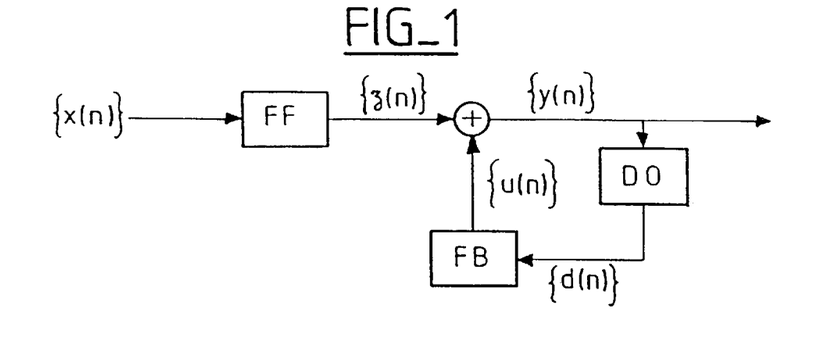
FIG. 1, already described, provides a schematic view of a time domain filtering device with decision feedback.

A more advantageous way to improve the correction of the intersymbol interference is to use an adaptive filter called decision feedback adaptive filter, working in the time domain. A filter of this kind, illustrated schematically in FIG. 1, is constituted by two temporal filters, a forward filter FF and a feedback filter FB, each receiving different series of symbols at input. The input of the forward filter FF receives symbols $\{x(n)\}$ produced by the sampling of the received signals, and the input of the feedback filter receives decisions $\{d(n)\}$, produced by a decision device C, from the symbols $\{y(n)\}$ produced after filtering by the forward filter FF. The symbols $\{y(n)\}$ are the outputs of the total filter.

The outputs $y(n)$ have the form:

$$y(n) = z(n) + u(n) \qquad (1),$$

where $$z(n) = \Sigma_i a_i x(n+i),$$

with i varying from 0 to M−1, represents the symbols produced by the forward filter FF, which comprises M weighting coefficients, and where $$u(n) = \Sigma_j b_j d(n-j),$$

with j varying from 1 to N, represents the symbols produced by the feedback filter FB from the decisions $d(n-1) = f(y(n-1))$ with $d(n-N) = f(y(n-N))$, with F as a decision function. The filter FB comprises N weighting coefficients $b_j$.

The operations for filtering the postcursor symbols $x(n-j)$ and the precursor symbols $x(n+i)$ are thus decorrelated. The filter FF is used for the correction of the intersymbol interference induced by the precursor symbols. The feedback filter FB is used for the correction of the intersymbol interference induced by the postcursor symbols.

Since the input/output data from the feedback filter FB come from a decision device, only the outputs y(n) are noise-sensitive. The decision feedback filters are thus less sensitive than the linear filters without looping in the presence of noise.

As the parasitic symbols appear chiefly in the postcursor part, the number M of corrective coefficients $a_i$ of the forward filter FF is much smaller than number N of corrective coefficients $b_j$ of the feedback filter FB. Typically these numbers are about M=30 to 60 coefficients for the forward filter FF and N=250 to 500 coefficients for the feedback filter FB.

A number N of coefficients such as this makes it difficult to integrate both the filters into a common integrated circuit. It is possible, if necessary, to reduce the number of coefficients for the feedback filter FB by using delay lines to shift groups of mainly active coefficients to the estimated positions of the echoes. However, this approach cannot easily be implemented in practice, as the circuit is overloaded with logic operations. Another approach lies in the use of a reduced number of coefficients in the feedback filter. The disadvantage of this kind of alternative approach is that the correction of the intersymbol interference is thereby less efficient.

In view of the above, it is a goal of the invention to implement an improved method of filtering, in which it is possible to correct the intersymbol interference without any reduction in the number of corrective coefficients, while at the same time reducing the complexity of the filters.

The approach suggested by the invention is that of implementing a frequency domain decision feedback filtering operation. This provides the benefit of the low complexity that characterizes frequency domain filtering (the symbols being processed in blocks of symbols) and, at the same time, gives advantages in terms of correction of the intersymbol interference from the decision feedback filtering operation. In term of complexity, the frequency domain filtering enables a significant reduction in the number of operators needed as compared with time domain processing, thus making it easier to set up the filter in a VLSI circuit.

Thus, the invention proposes a decision feedback filter device comprising a forward filter and a feedback filter for the production, from input symbols and output symbols, of the corresponding decisions, the forward filter receiving the input symbols at input, and the feedback filter receiving the decisions at input, characterized in that the forward filter carries out a frequency domain filtering of blocks of M input symbols, and in that the feedback filter carries out a frequency domain filtering of blocks of L decisions, with L being lower than M.

BRIEF DESCRIPTION OF THE DRAWINGS

Other particular features and advantages shall appear from the following description, in conjunction with the appended drawings, of which:

FIGS. 1 and 2 illustrate time domain decision feedback filtering.

DESCRIPTION OF THE PREFERRED EMBODIMENTS

A goal of the invention is to transpose the decision feedback filtering from the time domain into the frequency domain, the symbols being processed in blocks of symbols, and the filtering in the direct and feedback filters being done in the frequency domain.

Let it be assumed that the symbols are assembled in blocks of M symbols x(n) to x(n+M−1), these blocks being filtered simultaneously in order to produce output blocks y(n) to y(n+M−1). The relationship (1) defined here above is no longer applicable. Indeed, to compute y(n+1), it is necessary to have d(n). This entails the assumption that y(n) is known. It is thus not possible to produce y(n) and y(n+1) simultaneously. In other words, the transposition of the decision feedback filtering into the frequency domain is no trivial matter.

To solve this problem, the invention proposes to modify the above relationship (1) and to use the following relationship (2):

$$y(n)=z(n)+u(n) \qquad (2),$$

with $$z(n)=\Sigma_i\, a_i\, x(n+i-t),$$

i varying from 0 to M−1, $$u(n)=\Sigma_j\, b_j\, d(n-j-L),$$

j varying from 1 to N, t and L being integers.

Taking L>1, and assuming that the decisions prior to d(n) are known, it is possible to compute the outputs y(n) to y(n+L) simultaneously. It is therefore possible to compute the decisions d(n) to d(n+L). From these decisions, it is then possible to compute the outputs y(n+L+1) to y(n+2L) and so on and so forth.

By choosing L such that M=P*L with P as an integer, and N such as N=D*M, with D as an integer, the processing of a block (x(n) . . . x(n+M−1)) can be done in P successive stages.

Figure 2:
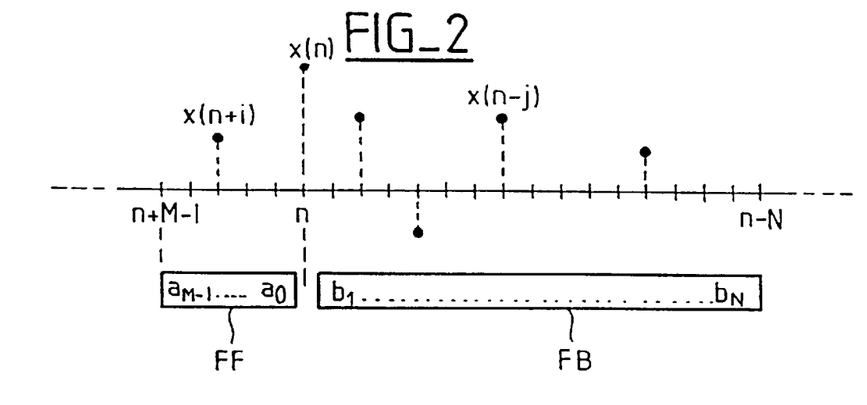
FIG. 2 represents the phenomenon of multipath propagation and the correction made by a time domain filtering device with decision feedback.
Figure 3:
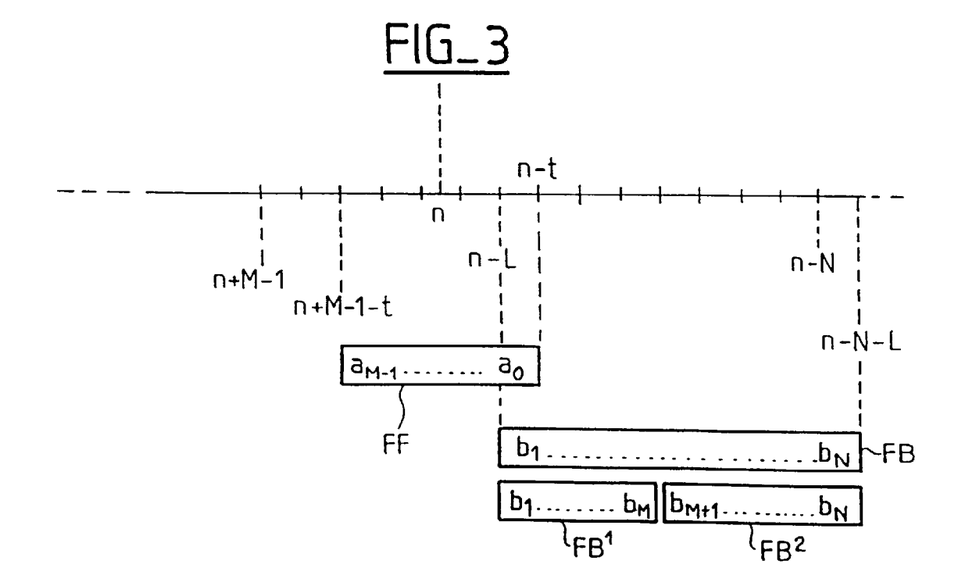
FIG. 3 illustrates the phenomenon of multipath propagation and the correction made by a filtering device according to the invention, FIG. 4 gives a schematic view of a filtering device according to the invention, FIG. 5 gives a schematic view of a first filter of the device of FIG. 4, FIG. 6 gives a schematic view of a second filter of the device of FIG. 4.

The outputs y(n) are produced from three components (see FIG. 3):

$$y(n)=z(n)+u1(n)+u_2(n) \qquad (3),$$

with $$z(n)=\Sigma_i\, a_i\, x(n+i-t),$$

i varying from 0 to M−1, $$u_1(n)=\Sigma_{j1}\, b_{j1}\, d(n-L-j1),$$

j2 varying from 1 to M (feedback sub-filter FB$^1$), $$u_2(n)=\Sigma_{j2}\, b_{j2}\, d(n-L-j2),$$

j2 varying from M+1 to N (feedback sub-filter FB$^2$),

As compared with FIG. 2, FIG. 3 shows a shift in the feedback filtering (formed by the two sub-filters FB$^1$ and FB$^2$ in the postcursive part). In other words, the decisions are provided to the feedback filter with a lag of L time intervals with respect to the taking of the decision. The forward filter is itself shifted. In practice, t≧·L is chosen, in order to filter the symbols x(n−1) with x(n−L) in the forward filter FF. Furthermore, the forward filter FF will include, in practice, a greater number M' of coefficients, such that N+M'−1−t is equal to N+M−1, so that for a given application (i.e. for a given number of postcursor symbols) the filtering of the postcursive part covers all the postcursive components.

The relationship (3) can be put in matrix form, the indices indicating the dimensions of the vectors and the exponent T signifying the transposed matrix:

$$y_M(n)=z_M(n)+u_M^1(n)+u_M^2(n) \qquad (4)$$

with $$y_M(n)=[y(n)\ \ldots\ y(n+M-1)]^T$$

$$z_M(n)=[z(n)\ \ldots\ z(n+M-1)]^T$$

$$u_M^1(n)=[u^1(n)\ \ldots\ u^1(n+M-1)]^T$$

$$u_M^2(n)=[u^2(n)\ \ldots\ u^2(n+M-1)]^T,$$

and for j from 0 to M−1:

$$z(n+j)=a_M^T(n)\, x_M(n+j+M-t)$$

$$u^1(n+j)=b_M^{1T}(n)\, d_M(n+j-1)$$

$$u_2(n+j)=b_{N-M}^{2T}(n)\, d_{M-N}(n-M+j-1)$$

$$y(n+j)=z(n+j)+u^1(n+j)+u^2(n+j),$$

with $$x_M(n+j+M-t)=[x(n+M-1-t+j)\ \ldots\ x(n-t+j)]^T,$$

$$d_M(n+j-1)=[d(n-L-1+j)\ \ldots\ d(n-L-M+j)]^T,$$

$$d_{N-M}(n-M+j-1)=[d(n-L-M-1+j)\ \ldots\ d(n-L-N+j)]^T.$$

$$a_M(n)=[a_{M-1}\ \ldots\ a_0]^T$$

$$b_M^1(n)=[b_1\ \ldots\ b_M]^T$$

$$b_{N-M}^2(n)=[b_{M+1}\ \ldots\ b_N]^T.$$

Having thus reformulated the time domain decision feedback filtering so that the symbols can be processed in blocks of symbols, the invention proposes to transpose this filtering to the frequency domain.

Figure 4:
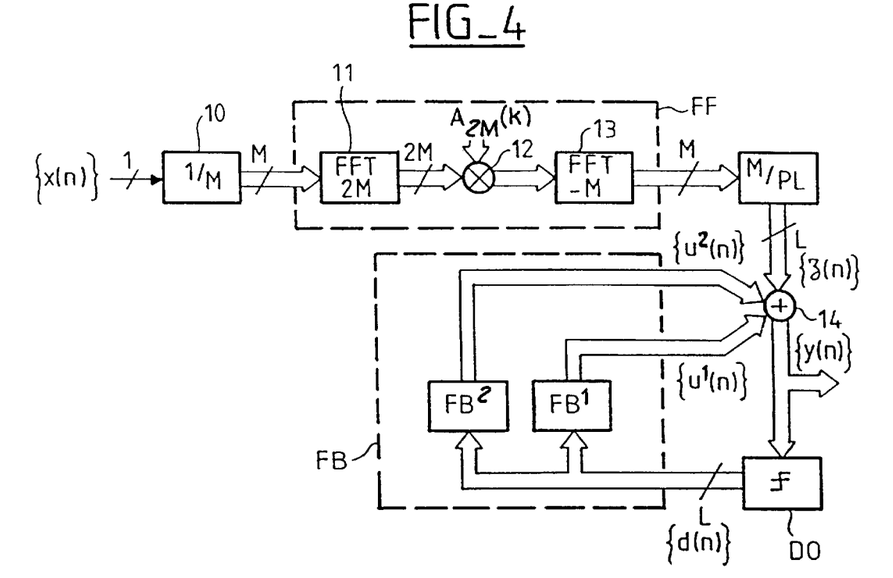

FIG. 4 illustrates a filter according to the invention.

The filter receives successive symbols x(n) at input.

By series/parallel conversion 10, the symbols are assembled in blocks $x^M(n)$ of M successive samples (x(n) ... x(n−M+1)), k representing the rank of the block.

These blocks go through a 2M order forward filter FF 1 (corresponding to the transposition of an M order time domain filter into the frequency domain). In the example shown, this filter FF has the standard structure of a frequency domain fast linear filter. For example, a partitioning of the input will be used according to the so-called overlap-save technique with an overlap rate of 50%. After a discrete Fourier transform 11 has been performed on the input blocks, they are multiplied in a multiplexer 12 by a block $A_{2M}(k)$ of 2M weighting coefficients. Then, by reverse Fourier transform 13, a block $z_M(n)$ of M symbols is produced at output of the filter FF.

The outputs y(n) are computed as a function of the output symbols from the filter FF and of decisions d(n) produced by a decision device DO from the preceding outputs, these decisions having been filtered by a 2N order frequency domain feedback filter FB (corresponding to the transposition of a time domain N order filter into the frequency domain). This feedback filter consists of two frequency domain sub-filters FB$^1$ and FB$^2$, illustrated respectively in FIGS. 5 and 6.

From these symbols and decisions d(n), an addition 14 enables the production, in the time domain, of the outputs y(n) corresponding to the input symbols x(n).

The outputs y(n) are therefore obtained by the addition of three components.

A first component of the relationship (3) is produced by the forward filter FF. These are output samples z(n) of this filter contained in the block $z_M(k)$.

A second component $u^1(n)$ is produced by the sub-filter FB$^1$ which corresponds to the 2M first coefficients of the filter FB.

A third component $u^2(n)$ is produced by the sub-filter FB$^2$ which corresponds to 2(N−M) last coefficients of the filter FB.

As we have seen, the difficulty to be resolved is that of obtaining, for each block of outputs, decisions needed for the computation of the outputs, these decisions corresponding to outputs of the same block.

It is assumed that the decisions corresponding to the last outputs produced are known.

The blocks of output symbols $z_M(k)$ are partitioned into sub-blocks of a size L with L as an integer such that L=M/P, with P as an integer.

From the sub-block corresponding to the L first output symbols of FF, the L corresponding outputs are produced by time domain summation (see relationship (3)). From these outputs, a block of L corresponding decisions is produced in a decision device DO.

These decisions are thus processed in the sub-filter FB$^1$ corresponding to a frequency domain linear filter (through the use for example of the overlap-save technique with an overlap rate of 50%).

The sub-filter FB$^1$ (FIG. 5) constitutes, by means of P shift circuits such as 15, P successive blocks of 2L symbols (P*L=M) after discrete Fourier transform 16 of the blocks of L decisions. The circuits 15 give, at output, blocks that are lagged with respect to one another by a time interval corresponding to L decisions. P multipliers 17 compute the products of the symbols of the P blocks by corresponding weighting coefficients that are assembled in blocks of 2L coefficients ($B_{2L}^{11}(n), \ldots B_{2L}^{1P}(n)$). The multipliers give, at output, P blocks of 2L symbols which are then summed up in parallel in an adder 18 whose output gives 2L symbols. These 26 symbols enable the production, by a reverse discrete Fourier transform, of a block of L symbols $u^1(n)$ in the time domain.

Figure 5:
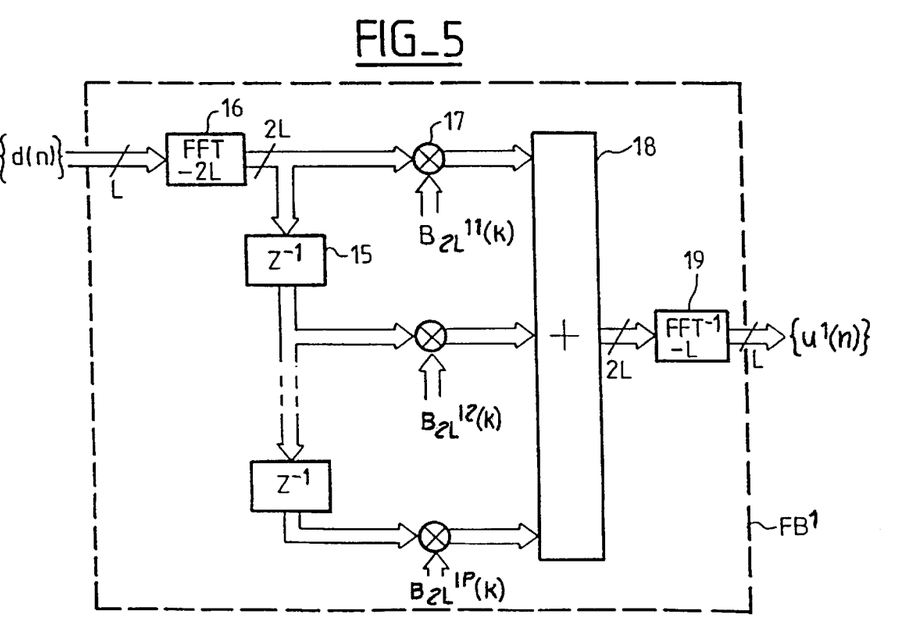
Figure 6:
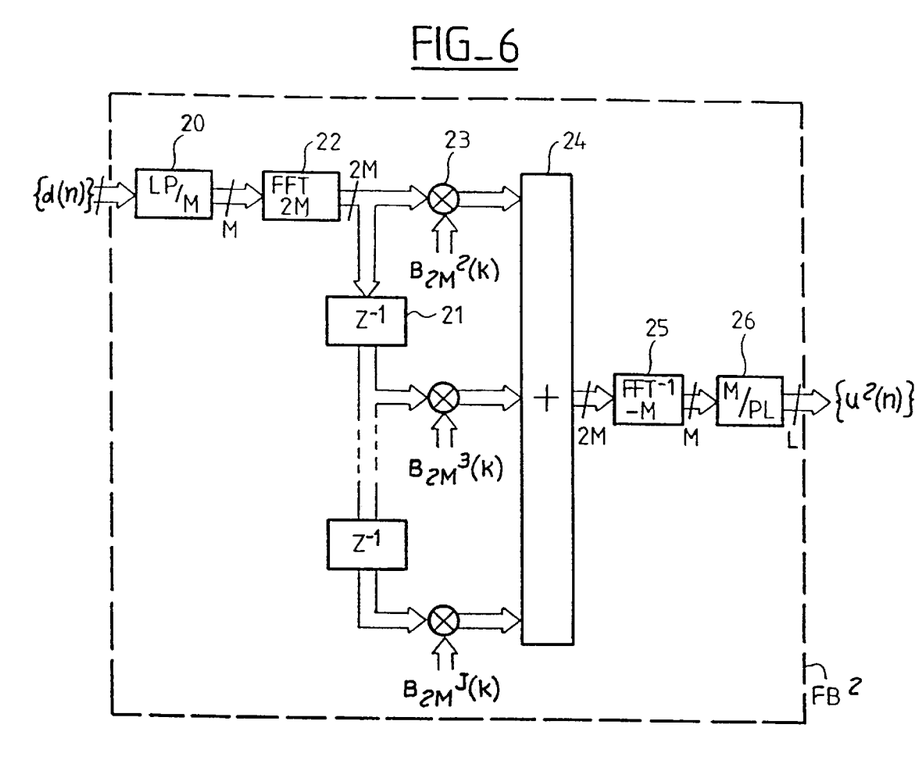

It is then possible to produce the L following outputs by the addition 14 in the time domain. Through the renewal of this operation P times, all the outputs (and consequently the decisions) corresponding to the M output symbols of the forward filter are produced successively. In one example, the sub-filter $FB^1$ (just like the sub-filter $FB^2$) is of the type described in the patent application FR-A-2 702 612. The sub-filter FB1, or the filter FB as a whole, therefore works at a frequency that is p times higher than that of the forward filter FF.

The sub-filter $FB^2$ (FIG. 6) corresponding to the N–M last coefficients of time domain feedback filtering has a structure comparable to that of the sub-filter $FB^1$. Just like the first sub-filter, it produces blocks of L symbols $u^2(n)$ added, in the time domain, with the sub-blocks of L output symbols of the forward filter to produce corresponding outputs. For a block of M output symbols of the forward filter FF and, unlike the first sub-filter, these symbols $u^2(n)$ are produced from decisions corresponding to the previous block of symbols of the forward filter FF. In other words, it is used in a manner similar to a feedback filter of a time domain decision feedback filter. The blocks of L decisions received from the decision device are grouped together in a step 20 in groups of M by parallel/parallel conversion. The sub-filter $FB^2$, by means of shift circuits such as 21, constitutes (J–1) successive blocks of 2M symbols (with J such that J*M=N) after Fourier transform 22 of the blocks of M decisions. The delay circuits 21 provide blocks at output that are lagged with respect to one another by a time interval corresponding to M decisions. J–1 multipliers 23 take the products of the symbols of the blocks by corresponding weighting coefficients grouped together in blocks of 2M coefficients ($B_{2M}^2$ (k), . . . ,$B_{2M}^J$(k)). The multipliers 23 give, at output, J–1 blocks of 2M symbols which are then summed up in parallel in an adder 24 whose output gives 2M symbols. These symbols enable the production, by reverse discrete Fourier transform 25 and parallel/parallel conversion 26, of P blocks of L symbols $u^2(n)$ in the time domain. These blocks $u^2(n)$ are used to compute the outputs corresponding to the output symbols from the forward filter of the block following the one from which they have been produced.

The filter thus described has the advantages, in terms of complexity, of frequency type applications and the advantages, in terms of performance, of decision feedback filtering.

To correct the intersymbol interference induced by the reception of echoes, as the input symbols (x(n)) are accompanied by precursor echoes x(n+j) and postcursor echoes x(n−j), the forward filter FF performs a filtering on the precursor echoes and on near postcursor echoes, and the feedback filter FB performs a filtering on the decisions produced from the postcursor echoes, these decisions being provided to the feedback filter with a delay of L time intervals, a time interval being the period of time between two successive symbols. Preferably, the forward filter carries out a filtering operation on the postcursor echoes whose corresponding decisions are not filtered by the feedback filter so that all the postcursor and precursor echoes are taken comprehensively into account by the total filter.

As has been seen, the weighting coefficients $A_{2M}$ $B_{2L}$ $B_{2M}$ are preferably variable in time so as to adapt the response of the filter to the variants of the transmission channel. In practice, the computation of the coefficients is uncoupled from the filtering itself. Since this computation generally requires a large number of operations, it is done most of the time on a deferred time basis by a digital signal processor (DSP) type of computation device.

Figure 7:
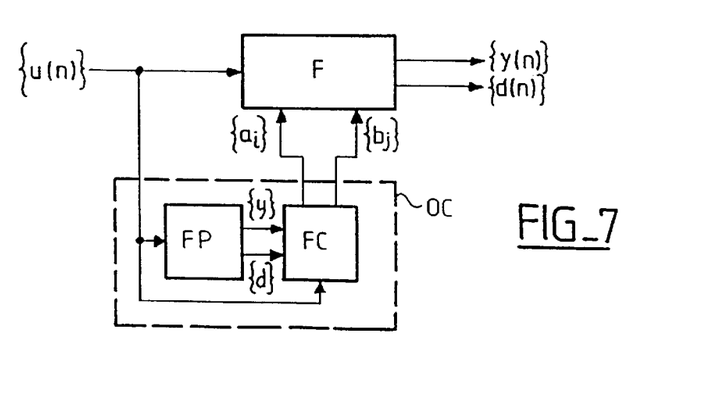
FIG. 7 shows a frequency domain adaptive filtering device.

In specific terms, an adaptive filter schematically takes the form shown in FIG. 7. The input symbols {x(n)} received are processed by a filter F for the production in real time, using weighting coefficients (referenced $a_i$ and $b_j$), of the corresponding outputs and decisions. The filter F will, for example, be a filter shown in FIG. 4. The weighting coefficients are produced by a computation element OC. From input symbols, it produces the corresponding outputs and decisions by means of a preliminary filter FP. These outputs and decisions are then used by a computation filter FC to produce the weighting coefficients which are given to the filter F.

It is quite possible to use different types of filters to make the filters F and FP. In practice, this is often the case. Since the filter F is used in real time, it is indispensable that its processing speed should be compatible with the symbol frequency. As far as the filter FP of the computation device is concerned, this constraint is not present. It is therefore possible to make a filter FP that has high precision, without being concerned about the time needed to produce the outputs and decisions, provided that the transmission channel is stationary for the period of computation of the coefficients. It is possible for example, for the filter FP, to use a frequency domain filter, a time domain filter or a decision feedback filter.

Figure 8:
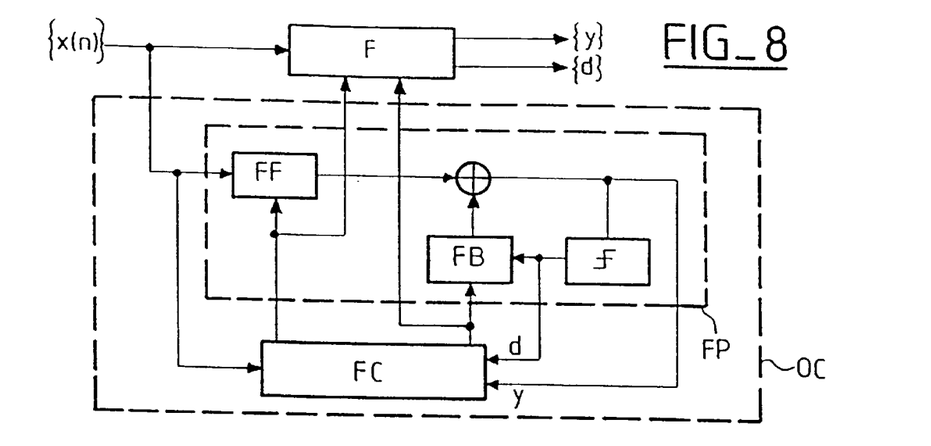
FIG. 8 represents an adaptive filtering device that comprises a coefficient computation device made with a decision feedback filter of the invention, FIG. 9 provides a schematic view of an algorithm for updating the coefficients of a computation device.

One way of making the computation device OC is to use a time domain decision feedback filter as shown in FIG. 8.

A standard algorithm for the adaptation of coefficients in the time domain, working step by step, is that of the least mean squares algorithm which can be put in the form:

$$a_M(n+1)=a_M(n)+2\mu^a.x_M(n+M).e(n),$$

$$b_N(n+1)=b_N(n)+2\mu^b.d_N(n).e(n),$$

with $$e(n)=d(n)-y(n)$$

and $\mu^a$ and $\mu^b$ being constants (representing a convergence pitch for the forward filter and the feedback filter).

LMS type filters are already known in the frequency domain (see for example E. R. Ferrara, "Frequency-Domain Adaptive Filtering", C. F. N. Cowan and P. M. Grant, ed. Adaptive Filters, Englewood Cliffs, Prentice Hall, 1985, Chapter 6, pp. 145–1479). One approach to the computation of the coefficients is to use a time domain decision feedback filter FP, working step by step, store the outputs and decisions produced and set up an LMS type frequency domain computation algorithm FC (in fact the computation algorithm then consists of two LMS type algorithms for the respective production of the coefficients of the forward filter and of the feedback filter).

The use of an algorithm FC made according to one improvement of the invention enables a considerable reduction in the complexity of the computation device OC. Indeed, it is then possible to obtain a frequency domain adaptation of the coefficients, the computation device then comprising a filter FP made in accordance with FIG. 4 and a computation filter FC made in accordance with FIG. 9 using a new formulation of the matching algorithms so that:

$$a_M(n+1)=a_M(n)+2\mu^a.x_M(n+M-t).e(n),$$

and $$b_N(n+1)=b_N(n)+2\mu^b.d_N(n-L).e(n)$$

It is possible, in the adaptive part, to choose to work on blocks of N symbols. In other words, the adaptation of the coefficients in the filter F is delayed by N time intervals (a time interval corresponding to the time gap between two successive symbols). In practice, it is even possible to delay the adaptation of the coefficients in the filter F by several blocks of N symbols if the environment is assumed to be stationary for some milliseconds (this corresponds in standard applications to some tens of blocks of N symbols).

Figure 9:
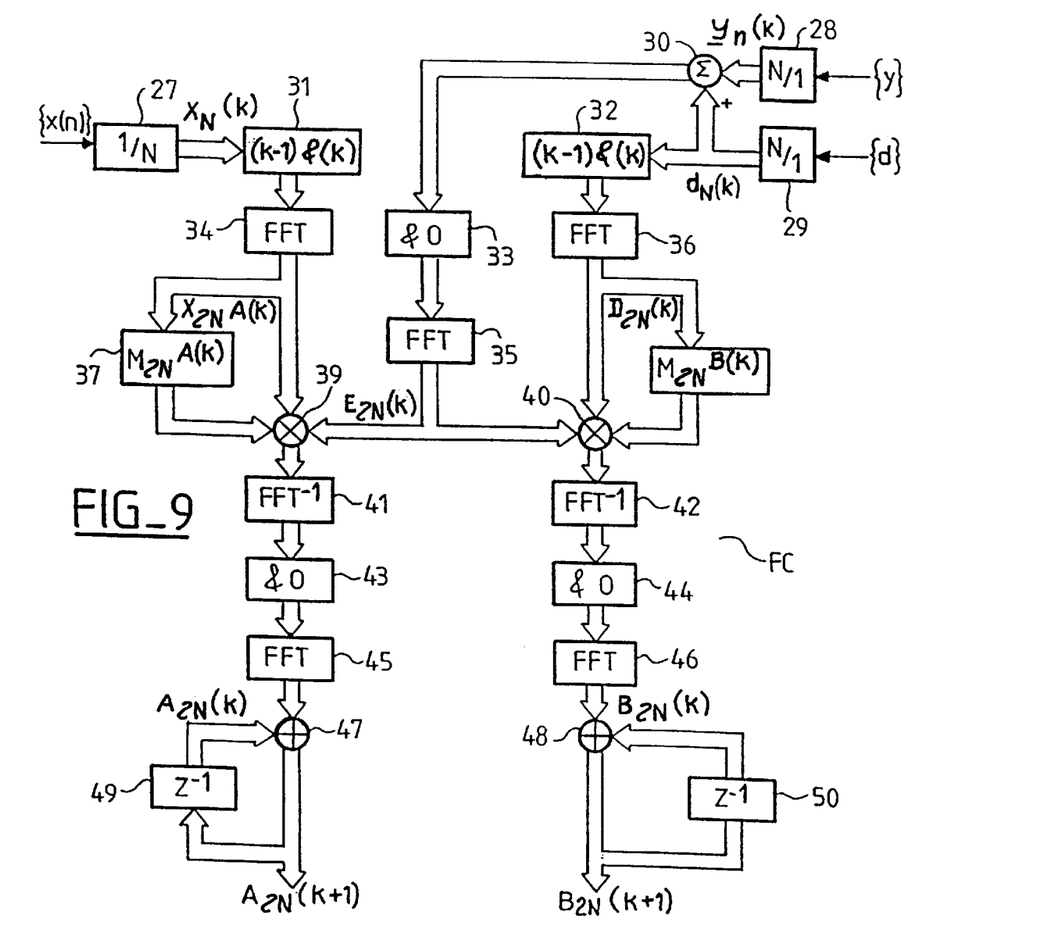

A description shall now be given of the computation algorithm FC shown in FIG. 9. To facilitate understanding by the reader, a mathematically formalistic approach will be used. Specifically, this algorithm will typically be made in the form of a digital signal processor (or DSP).

The symbols $x(n)$, $y(n)$ and $d(n)$ are assembled in series/parallel converters 27–29 in blocks $x_M(k)=(x(kN+M-t) \ldots x(kN+M-t+N-1))$, $y_N(k)=y(kN-L) \ldots y(kN-L+N-1))$ and $d_N(k)=(d(kN-L) \ldots d(kN-L+N-1))$ of N successive symbols and decisions. From the blocks $y_N(k)$ and $d_N(k)$, a summator 30 is used to produce an block of errors $e_N(k)=d_N(k)-y_N(k)$.

Using the $k^{th}$ blocks $x_N(k)$ and $d_N(k)$, concatenation devices 31–32 are used to produce blocks of 2N elements by concatenation with the (k−1)th corresponding blocks, the block $e_N(k)$ for its part being complemented by N zeros in a concatenation device 33.

A passage into the frequency domain is then got by discrete Fourier transforms 34–36. Thus, matrices $X_{2N}(k)$, $D_{2N}(k)$ and $E_{2N}(k)$ are produced such that:

$X_{2N}(k)=\text{diag}\{FFT[x_N(k-1); x_N(k)]^T\}$ $D_{2N}(k)=\text{diag}\{FFT[d_N(k-1); d_N(k)]^T\}$ $E_{2N}(k)=FFT\{Q^{OT}e_N(k)\}$ with $Q^{OT}=[O_N; I_N]$, $O_N$ and $I_N$ being respectively the N-dimensioned identically zero square matrix and identity matrix; : signifying a concatenation by juxtaposition; diag signifying the diagonal matrix; and FFT signifying the discrete Fourier transform operation.

It will be noted that the matrices are in practice blocks of 2N elements represented mathematically, with a view to concision, by diagonal matrices with a dimension 2N.

Then, in the recursive filters 37 and 38, there are produced matrices with a dimension 2N, referenced $M_{2N}^A(k)$ and $M_{2N}^B(k)$ such that:

$M_{2N}^A(k)=2\mu^a.\text{diag}\{[P_1^{-x}(k), \ldots, P_{2N}^{-x}(k)]^T\}$ $M_{2N}^B(k)=2\mu^b.\text{diag}\{[P_1^{-d}(k), \ldots, P_{2N}^{-d}(k)]^T\}$, with $P_{2N}^x(k)=\lambda P_{2N}^x(k-1)+(1-\lambda)X_{2N}^H(k).X_{2N}(k)1_{2N}$ $P_{2N}^d(k)=\lambda P_{2N}^d(k-1)+(1-\lambda)D_{2N}^H(k).D_{2N}(k)1_{2N}$ $1_{2N}$ being a vector with a dimension 2N having all its elements at 1 to obtain a result vector, $\lambda$ being a neglect factor less than 1, H signifying the transpose and $\text{diag}P_1^{-x}(k)$ signifying the constitution of a diagonal matrix whose non-zero terms are the inverse values (whence the exponent −) of the components of the vector $X_1(k), \ldots, X_2N(k)$, and similarly for $\text{diag}P_1-d(k)$ with the vector $D_1(k), \ldots, D_{2N}(k)$.

By using two multipliers 39, 40, the following matrices are then produced:

$M_{2N}^{AX}(k)=M_{2N}^A(k).x_{2N}^H(k).E_{2N}$ and $M_{2N}^{BD}(k)=M_{2N}^A(k).D_{2N}^H(k).E_{2N}$ The diagonal matrices $M_{2N}^{AX}(k)$ and $M_{2N}^{BD}(k)$ are then transposed into the time domain by reverse discrete Fourier transform operations 41, 42.

Then, in the concatenation devices 43, 44, the 2N−M last elements of the block $M_{2N}^{AX}(k)$ and the N last elements of $M_{2N}^{BD}(k)$ are cancelled. This mathematically consists of the computation $Q^M.M_{2N}^{AX}(k)$ and $Q^N M_{2N}^{BD}(k)$, with:

$$Q^M = \begin{vmatrix} I_{M*M} & 0_{M*2N-M} \\ 0_{2N-M*M} & 0_{2N-M*2N-M} \end{vmatrix}$$

and $$Q^N = \begin{vmatrix} I_{N*N} & 0_{N*N} \\ 0_{N*N} & 0_{N*N} \end{vmatrix}$$

The blocks are then transposed at 45, 46 into the frequency domain by discrete Fourier transform.

In order to produce $A_{2N}(k+1)$ and $B_{2N}(k+1)$, it is enough to use two adders 47, 48 and two delay circuits 49, 50 so that the following computation is done:

$A_{2N}(k+1)=A_{2N}(k)+FFT(Q^M M_{2N}^{AX}(k))$ $B_{2N}(k+1)=B_{2N}(k)+FFT(Q^N M_{2N}^{BD}(k))$

Specifically, two blocks of 2N elements are produced (these blocks being formed by diagonal elements of the matrices $A_{2N}(k+1)$ and $B_{2N}(k+1)$).

What is claimed is:

1. Decision feedback filter device comprising a forward filter (FF) and a feedback filter (FB) for the production, from input symbols (x(n)), of the corresponding decisions (d(n)), the forward filter (FF) receiving the input symbols at input, and the feedback filter (FB) receiving the decisions (d(n)) at input, characterized in that the forward filter (FF) carries out a frequency domain filtering of blocks of M input symbols, and in that the feedback filter (FB) carries out a frequency domain filtering of blocks of L decisions, with L being lower than M.

2. Device according to claim 1, characterized in that the forward filter (FF) produces blocks of M output symbols (z(n)), these blocks being converted into sub-blocks of L output symbols, these sub-blocks being combined with blocks of L symbols (u1(n)), u2(n)) produced by the feedback filter (FB) to produce outputs (y(n)) from which the decisions (d(n)) are produced.

3. Device according to claim 2, characterized in that the outputs (y(n)) are produced by addition, in the time domain, of the sub-blocks of output symbols (z(n)) with the blocks of symbols produced by the feedback filter (FB).

4. Device according to one of claim 1, characterized in that the feedback filter (FB) comprises a first sub-filter and a second sub-filter (FB$^1$, FB$^2$), the first sub-filter (FB$^1$) performing a filtering operation on the blocks of L decisions, and second sub-filter (FB$^2$) performing a filtering operation on blocks of M decisions after conversion of the blocks of L decisions into blocks of M decisions, the symbols (u2(n)) produced by this second sub-filter being converted into blocks of L decisions at output of this sub-filter.

5. Method for the correction of the intersymbol interference induced by the reception of echoes with a filtering device defined according to claim 1, the input symbols (x(n)) being accompanied by precursor echoes (x(n+I)) and postcursor echoes (x(n+j)), characterized in that the forward filter (FF) carries out a filtering operation on the postcursor echoes and in that the feedback filter (FB) carries out a filtering operation on the decisions produced from the postcursor echoes, these decisions being provided to the feedback filter with a delay of L time intervals, a time interval being the period of time between two successive symbols.

6. Method according to claim 5, wherein the forward filter carries out a filtering operation on the postcursor echoes whose corresponding decisions are not filtered by the feedback filter.

7. Adaptive filtering device comprising a computation device (OC) to produce weighting coefficients, the computation device comprising a preliminary filter (FP) to produce outputs and decisions from input symbols, and a computation filter (FC) to produce the weighting coefficients from these pieces of data, characterized in that the preliminary filter is a filtering device defined according claim 1.

8. Device according to claim 7, characterized in that the computation filter produces the weighting coefficients in the frequency domain according to the least mean squares method.

* * * * *

UNITED STATES PATENT AND TRADEMARK OFFICE
CERTIFICATE OF CORRECTION

PATENT NO. : 6,052,702
DATED : April 18, 2000
INVENTOR(S) : Berberidis, et al

It is certified that error appears in the above-identified patent and that said Letters Patent is hereby corrected as shown below:

On the title page, item [73] Assignee, should read

-- France Telecom of Paris, France

Telediffusion De France of Paris, France --

Signed and Sealed this

Fifteenth Day of August, 2000

*Attest:*

Q. TODD DICKINSON

*Attesting Officer*     *Director of Patents and Trademarks*